United States Patent
Hosokai

(10) Patent No.: US 7,391,108 B2
(45) Date of Patent: Jun. 24, 2008

(54) PACKAGE OF SOLID-STATE IMAGING DEVICE

(75) Inventor: Shigeru Hosokai, Hachioji (JP)

(73) Assignee: Olympus Corporation, Tokyo (JP)

( * ) Notice: Subject to any disclaimer, the term of this patent is extended or adjusted under 35 U.S.C. 154(b) by 234 days.

(21) Appl. No.: 11/072,257

(22) Filed: Mar. 7, 2005

(65) Prior Publication Data
US 2005/0195303 A1    Sep. 8, 2005

(30) Foreign Application Priority Data
Mar. 8, 2004    (JP) .............................. 2004-063681

(51) Int. Cl.
*H01L 23/48* (2006.01)
(52) U.S. Cl. ........................................ 257/693; 257/678
(58) Field of Classification Search .................. 257/693
See application file for complete search history.

(56) References Cited

U.S. PATENT DOCUMENTS
2001/0045640 A1* 11/2001 Oida et al. .................. 257/692

FOREIGN PATENT DOCUMENTS
JP    05122617    5/1993

* cited by examiner

*Primary Examiner*—Kiesha L Rose
(74) *Attorney, Agent, or Firm*—Westerman, Hattori, Daniels & Adrian, LLP.

(57) ABSTRACT

Disclosed herein is a package of solid-state imaging device for enclosing the solid-state imaging device having a plurality of signal output pads for outputting image signals, provided correspondingly to each of a plurality of image outputs, including: a plurality of inner leads for effecting electrical connection with each of the plurality of signal output pads of the solid-state imaging device; a plurality of lead frames each having a same configuration with another, formed correspondingly to each of the plurality of inner leads as continuation therefrom; and a plurality of electrical connection means formed as continuously connected to each of the plurality of lead frames.

8 Claims, 7 Drawing Sheets

US 7,391,108 B2

PACKAGE OF SOLID-STATE IMAGING DEVICE

This application claims benefit of Japanese Patent Application No. 2004-63681 filed in Japan on Mar. 8, 2004, the contents of which are incorporated by this reference.

BACKGROUND OF THE INVENTION

The present invention relates to packages of solid-state imaging device for sealing the solid-state imaging device having a plurality of image signal output lines.

An example of package of solid-state imaging device generally used to seal the solid-state imaging device having a plurality of image signal output lines as disclosed in Japanese Patent Application Laid-Open Hei-5-122617 is shown in FIGS. 1A to 1E. FIG. 1A is a top view; FIG. 1B is a front view; FIG. 1C is a sectional view along line c-c in FIG. 1A; FIG. 1D is a side view; and FIG. 1E is a sectional view along line e-e in FIG. 1A. In the package structure of this construction, a solid-state imaging device chip 13 is bonded to a package 10 by means of die bonding and the solid-state image device chip 13 is then connected through bonding wire 14 to a terminal end portion of lead frame 12 which is referred to as an inner lead portion 12A. The inner lead portion 12A itself is extended within the package 10 and becomes an outer lead portion 12B when it is protruded to the outside of the package 10. The package 10 is then hermetically sealed with a glass plate 17.

In recent years, more pixels tend to be employed in the solid-state imaging device to be sealed in a package of solid-state imaging device so that it is necessary to increase the signal reading rate in order to maintain the number of frames to be read out per unit time. For this reason, image signals are read out by using a plurality of signal output lines (multi-line readout). Examples of the solid-state imaging device having a plurality of image signal output lines are shown in FIGS. 2 to 4.

Of the solid-state imaging device shown in FIG. 2, a light receiving area 1000 is divided into four regions of A, B, C, D so that image signals respectively of the divided regions A to D are outputted in parallel with respect to each other. In particular, the image signals of region A in the light receiving area 1000 are to be outputted to A-output pad 1120 through an output amplifier 1130 by a vertical scanning circuit 1110 and horizontal read circuit 1100. Similarly, the image signals of region B are read out to B-output pad 1121 through an output amplifier 1131 by a vertical scanning circuit 1111 and horizontal read circuit 1101; the image signals of region C are read out to C-output pad 1122 through an output amplifier 1132 by a vertical scanning circuit 1112 and horizontal read circuit 1102; and the image signals of region D are outputted to D-output pad 1123 through an output amplifier 1133 by a vertical scanning circuit 1113 and horizontal read circuit 1103. By thus effecting the image signal read operation in parallel, the image signals can be read out in ¼ the time in the case where the light receiving area is not divided. In the case of this construction, if image outputs from the respective output amplifiers 1130, 1131, 1132, 1133 are to be fetched to the outside of the solid-state imaging device through a shortest wiring route, the output pads 1120, 1121, 1122, 1123 are to be disposed at the four corners of the solid-state imaging device.

The solid-state imaging device shown in FIG. 3 is constructed so that a pixel array of light receiving area 1000 is read out by two pixel columns at a time in parallel. The odd-numbet pixel columns 1-1, 2-1, 3-1, . . . n-1 of the light receiving area 1000 are read out to an output pad 1220-1 through an output amplifier 1230-1 by a vertical scanning circuit 1210 and horizontal read circuit 1200-1, and in a similar manner, the even-number pixel columns 1-2, 2-2, 3-2, . . . n-2 are read out through an output amplifier 1230-2 by the vertical scanning circuit 1210 and a horizontal read circuit 1200-2. By thus effecting the image signal read operation in parallel, the read time can be shortened to ½. In the case of this construction, if image outputs from the respective output amplifiers 1230-1, 1230-2 are to be fetched through a shortest wiring route to the outside of the solid-state imaging device, the two outputting sections are disposed in a close proximity to each other for example by locating the output pads 1220-1, 1220-2 next to each other.

Shown in FIG. 4 is a solid-state imaging device where the read methods of image signals shown in FIGS. 2 and 3 are combined. In particular, the solid-state imaging device shown in FIG. 4 makes readout at a yet higher rate possible such that, of the read regions obtained by dividing the light receiving area 1000 into four portions, two pixel columns are concurrently read out by the method shown in FIG. 3. FIG. 4 includes: A1-1, A1-2, . . . D2-1, D2-2, . . . , divided pixel columns; 1300-1, . . . 1303-2, horizontal read circuits; 1310, . . . 1313, vertical scanning circuits; 1320-1, . . . 1323-2, output pads; and 1330-1, . . . 1333-2, output amplifiers. In the case of this construction, if image outputs from the respective output amplifiers 1330-1, . . . 1333-2 are to be fetched through a shortest wiring route to the outside of the solid state imaging device, the output pads in each pair 1320-1/1320-2, 1321-1/1321-2, 1322-1/1322-2, 1323-1/1323-2 are disposed next to each other and the pairs of the output pads are disposed at the four corners of the solid-state imaging device, respectively.

SUMMARY OF THE INVENTION

It is a main object of the present invention to provide a package of solid-state imaging device in which the disposition of a plurality of signal output pads, inner leads, lead frames and external connection means is effected with considering their configuration and pitch whereby the conditions of wiring resistance, inductance, and stray capacitance of a plurality of wiring within the package are made uniform so that the level discrepancy among a plurality of adjacently outputted image signals can be reduced to a lower level.

It is another object of the invention to provide a package of solid-state imaging device with which variance among signal outputs is reduced in the solid-state imaging device having a plurality of signal outputs. It is yet another object of the invention to provide a package of solid-state imaging device with which variance among signal outputs is reduced in the solid-state imaging device having a plurality of signal output pads that are disposed next to each other. It is still another object of the invention to provide a package of solid-state imaging device with which variance among signal outputs is additionally reduced in the solid-state imaging device having a plurality of signal output pads that are disposed next to each other. It is a further object of the invention to provide a package of solid-state imaging device with which variance among signal outputs is reduced in the solid-state imaging device where a pad having other function is adjacently located between a plurality of signal output pads. It is yet a further object of the invention to provide a package of solid-state imaging device with which variance among signal outputs is additionally reduced in the solid-state imaging device where a pad having other function is adjacently located between a plurality of signal output pads.

In a first aspect of the invention, there is provided a package of solid-state imaging device for enclosing the solid-state imaging device having a plurality of signal output pads for outputting image signals, provided correspondingly to each of a plurality of image outputs. It includes: a plurality of inner leads for effecting electrical connection with each of the plurality of signal output pads of the solid-state imaging device; a plurality of lead frames each having a same configuration with another, formed correspondingly to each of the plurality of inner leads as continuation therefrom; and a plurality of electrical connection means formed as continuously connected to each of the plurality of lead frames.

In a second aspect of the invention, the plurality of inner leads, the plurality of lead frames and the plurality of electrical connection means in the package of solid-state imaging device according to the first aspect are formed so that a pitch between adjacent inner leads, a pitch between adjacent lead frames and a pitch between adjacent electrical connection means are respectively substantially uniform.

In a third aspect of the invention, the plurality of inner leads and the plurality of electrical connection means in the package of solid-state imaging device according to the second aspect are formed so that the pitch between adjacent inner leads and the pitch between adjacent electrical connection means are substantially equal to a pitch between adjacent signal output pads of the plurality of signal output pads.

In a fourth aspect of the invention, there is provided a package of solid-state imaging device for enclosing the solid-state imaging device having: a plurality of signal output pads for outputting image signals, provided correspondingly to each of a plurality of image outputs; and a second pad having a function different from the plurality of signal output pads. It includes: a plurality of inner leads for effecting electrical connection with each of the plurality of signal output pads and the second pad; a plurality of lead frames each having a same configuration with another, formed correspondingly to each of the plurality of inner leads as continuation therefrom; and a plurality of electrical connection means formed as continuously connected to each of the plurality of lead frames; wherein a pitch between adjacent inner leads of the plurality of inner leads and a pitch between adjacent electrical connection means of the plurality of electrical connection means are made respectively substantially uniform.

In a fifth aspect of the invention, the plurality of inner leads and the plurality of electrical connection means in the package of solid-state imaging device according to the fourth aspect are formed so that the pitch between adjacent inner leads and the pitch between adjacent electrical connection means are substantially equal to a pitch between adjacent pads of the plurality of pads including the signal output pads and the second pad.

DESCRIPTION OF THE PREFERRED EMBODIMENT

Some embodiments of the present invention will now be described. First, a description will be given below with respect to a first embodiment of the package of solid-state imaging device according to the invention. Construction of the package of solid-state imaging device according to the first embodiment is shown in FIGS. 5A to 5C.

Figure 1B:
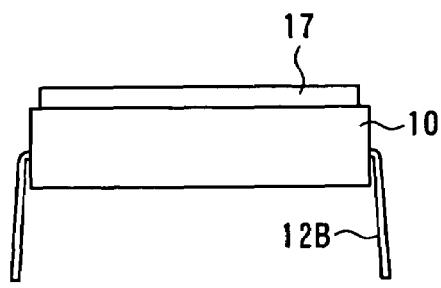
FIGS. 1A to 1E are a top view, side views and sectional views showing a prior-art package of solid-state imaging device.
Figure 1C:
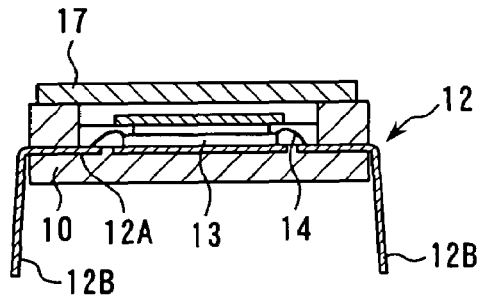
Figure 1A:
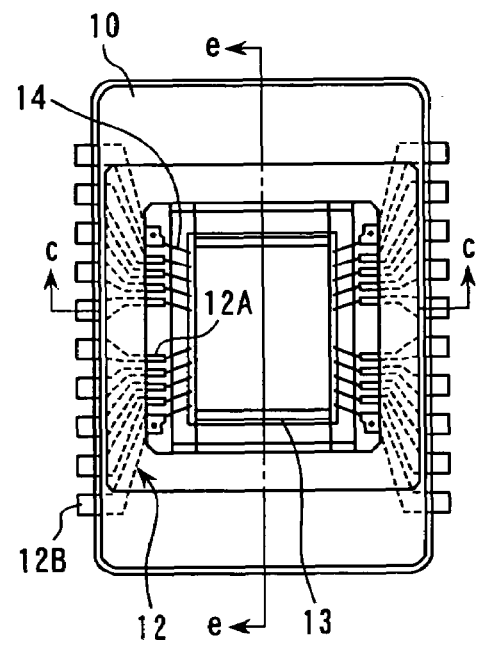
Figure 1D:
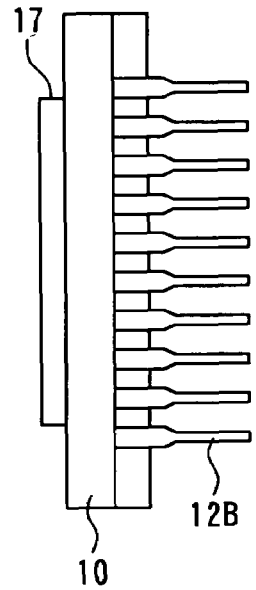
Figure 1E:
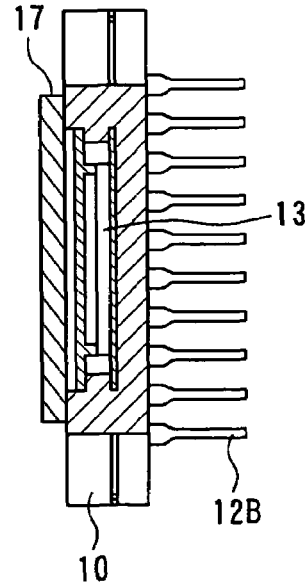
Figure 2:
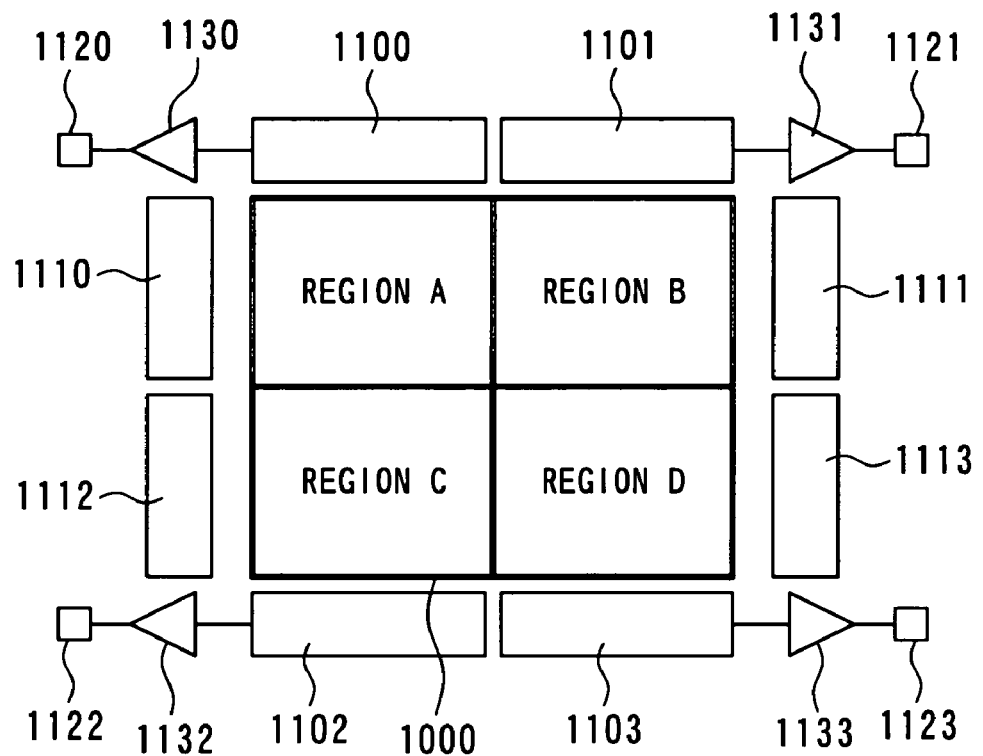
FIG. 2 shows an example of solid-state imaging device having a plurality of signal output lines.
Figure 5A:
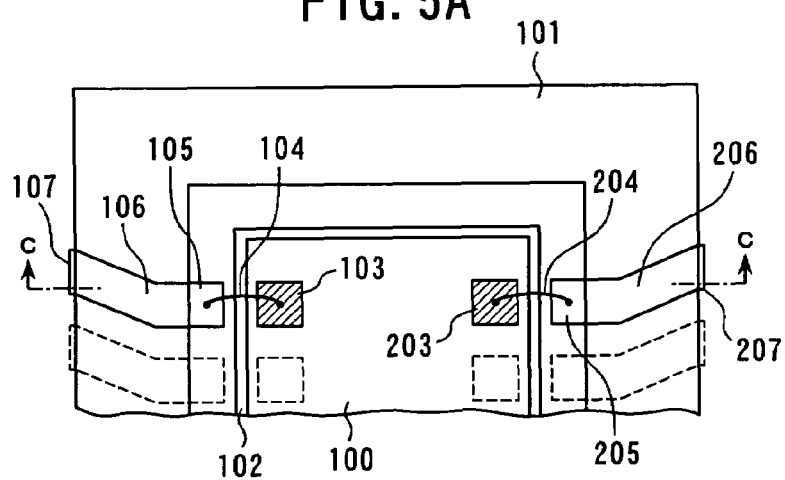
FIGS. 5A to 5C are a top view, side view and sectional view, respectively, showing construction of a first embodiment of the package of solid-state imaging device according to the invention.
Figure 5B:
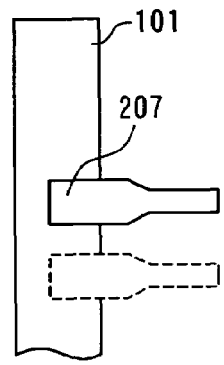
Figure 5C:
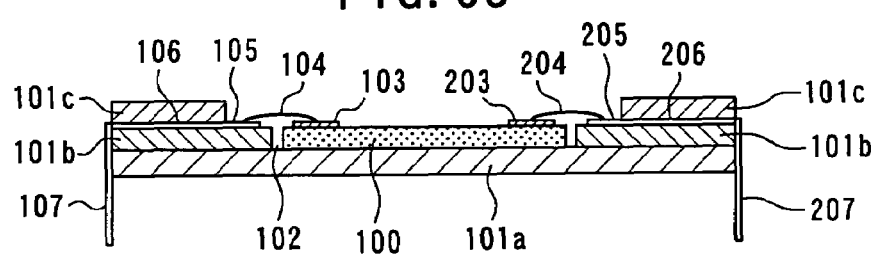

FIG. 5A is a top view; FIG. 5B is a side view; and FIG. 5C is a sectional view along line c-c in FIG. 5A. This embodiment can be applied to a solid-state imaging device having a plurality of signal output lines of the construction shown in FIG. 2.

In this embodiment, signal output pads 103, 203 indicated by slants and disposed on opposite sides of the solid-state imaging device in FIG. 5A each are the pad for outputting image signals. A solid-state imaging device 100 thus having a plurality of pads for outputting image signals is dropped into a concave cavity 102 of a package 101 and is die-bonded thereto. The signal output pad 103 of the solid-state imaging device 100 is connected through a bonding wire 104 to an inner lead portion 105 that is one terminal end portion of a lead frame 106 provided on the package 101. Further, the other end portion of the lead frame 106 is connected to a lead-type electrical external connection means 107. Similarly, the signal output pad 203 placed in opposition to the signal output pad 103 is connected through a bonding wire 204 to an inner lead portion 205 that is one terminal end portion of a lead frame 206 provided on the same package 101. Further, the other end portion of the lead frame 206 is connected to a lead-type electrical external connection means 207. It should be noted that the solid-state imaging device die-bonded into the interior of the package 101 is to be hermetically sealed with a glass plate (not shown).

Moreover, in this embodiment, the package 101 is formed of three layers 101a, 101b, 101c, and the lead frames 106, 206 are placed between the layer 101b and layer 101c. Here the lead frames 106, 206 electrically connected respectively to the plurality of signal output pads 103, 203 are formed into the same configuration with each other. In FIGS. 5A, 5B, the members indicated by dotted line are the pads having different function from the signal output pads and those inner lead portions, lead frames and electrical external connection means that are connected thereto.

By thus forming the lead frames to be connected to the plurality of signal output pads into the same configuration with each other, the wiring resistance of a wiring within the package consisting of the route from the signal output pad to the electrical external connection means through the bonding wire, inner lead portion and lead frame becomes substantially the same with each other so that difference in signal among a plurality of output signals is reduced. As a result, the level discrepancy in the output image signals outputted from the plurality of output signal lines can be suppressed.

Figure 3:
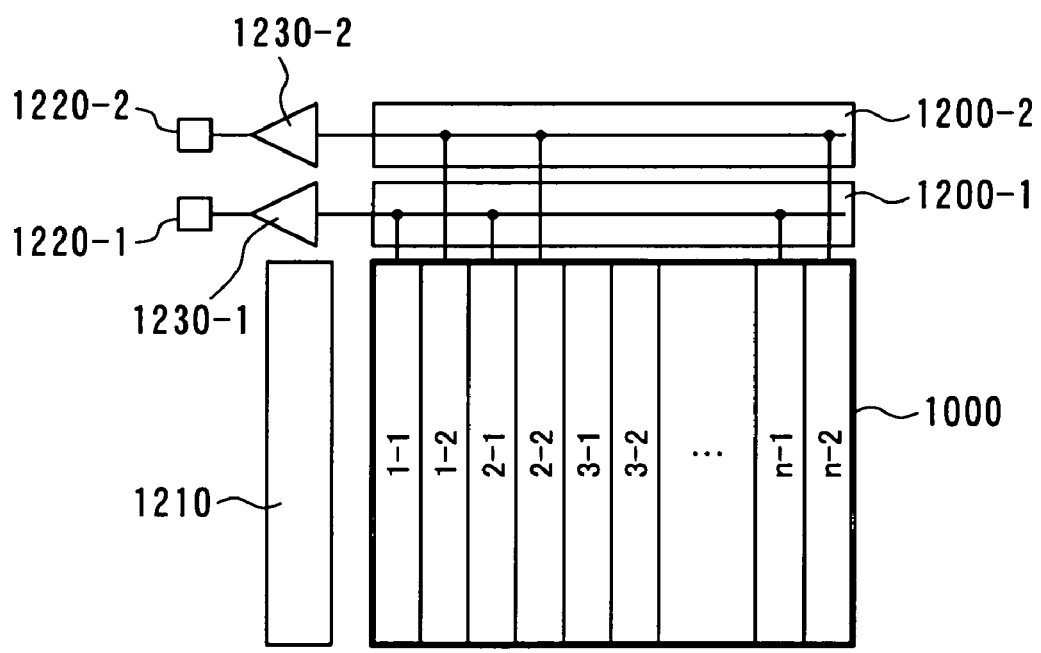
FIG. 3 shows another example of solid-state imaging device having a plurality of signal output lines.
Figure 6A:
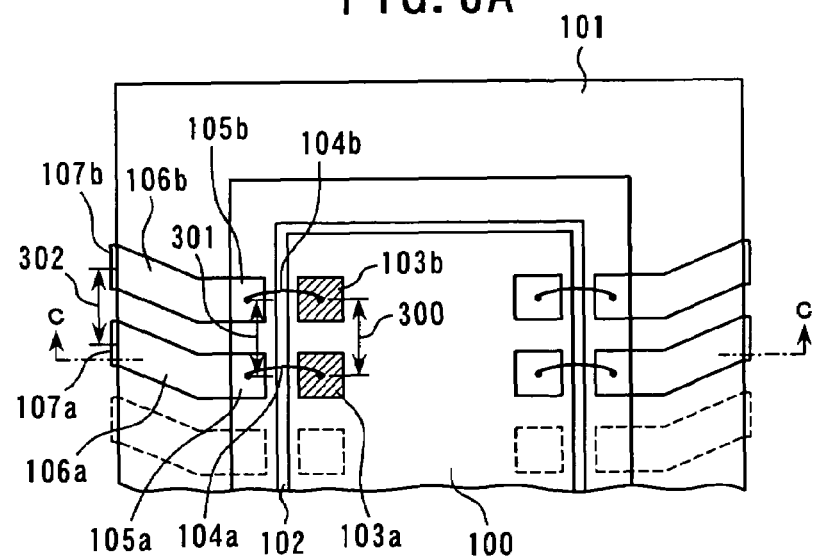
FIGS. 6A to 6C are a top view, side view and sectional view, respectively, showing construction of the package of solid-state imaging device according to a second embodiment of the invention.
Figure 6B:
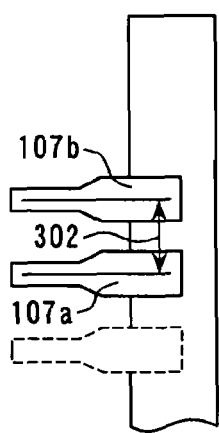
Figure 6C:
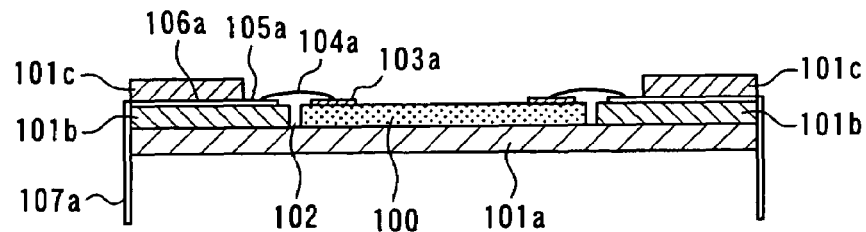

A second embodiment will now be described. Construction of the package of solid-state imaging device according to the second embodiment is shown in FIGS. 6A to 6C. FIG. 6A is a top view; FIG. 6B is a side view; and FIG. 6C is a sectional view along line c-c in FIG. 6A. This embodiment can be applied to a solid-state imaging device having a plurality of signal output lines of the construction shown in FIG. 3.

In this embodiment, signal output pads 103a, 103b indicated by slants and disposed next to each other on the same side of the solid-state imaging device in FIG. 6A each are the pad for outputting image signals. A solid-state imaging device 100 thus having a plurality of pads for outputting image signals is dropped into a concave cavity 102 of a package 101 and is die-bonded thereto. The signal output pad 103a of the solid-state imaging device 100 is connected through a bonding wire 104a to an inner lead portion 105a that is one terminal end portion of a lead frame 106a provided on the package 101. Further, the other end portion of the lead frame 106a is connected to a lead-type electrical external connection means 107a. Similarly, the adjacently located signal output pad 103b is connected through a bonding wire 104b to an inner lead portion 105b that is one terminal end portion of a lead frame 106b. Further, the other end portion of the lead frame 106b is connected to an electrical external connection means 107b. It should be noted that the solid-state imaging device die-bonded into the interior of the package 101 is to be hermetically sealed with a glass plate (not shown).

Moreover, in this embodiment, the package 101 is formed of three layers 101a, 101b, 101c, and the lead frames 106a, 106b are placed between the layer 101b and layer 101c. The lead frames 106a, 106b formed correspondingly to the signal output pads 103a, 103b located next to each other on the same side are formed into the same configuration with each other. Further, the lead frames 106a, 106b are formed and disposed so that pitch 301 between the inner lead portions 105a and 105b becomes equal to pitch 302 between the electrical external connection means 107a and 107b. It is also possible to make pitch 300 of the signal output pads 103a, 103b, equal to pitch 301 of the inner lead portions 105a, 105b, and pitch 302 of the electrical external connection means 107a, 107b, and, in this case, the wiring resistance of wiring within the package can be made uniform including the bonding wire.

The lead frames to be connected to the signal output pads located next to each other on the same side of the solid-state imaging device are thus formed into the same configuration with each other and, in addition, pitch of the inner lead portions and pitch of the external electrical connection means are made identical to each other including the pitch of the signal output pads, whereby the wiring resistance, inter-wire capacitance, inductance, etc., of the wiring routes adjacent to each other within the package consisting of the route from the signal output pad to the electrical external connection means through the bonding wire, inner lead portion and lead frame become substantially identical so that difference in signal among a plurality of output signals is reduced. As a result, the level discrepancy in the output image signals outputted from the plurality of output signal lines can be suppressed.

Figure 4:
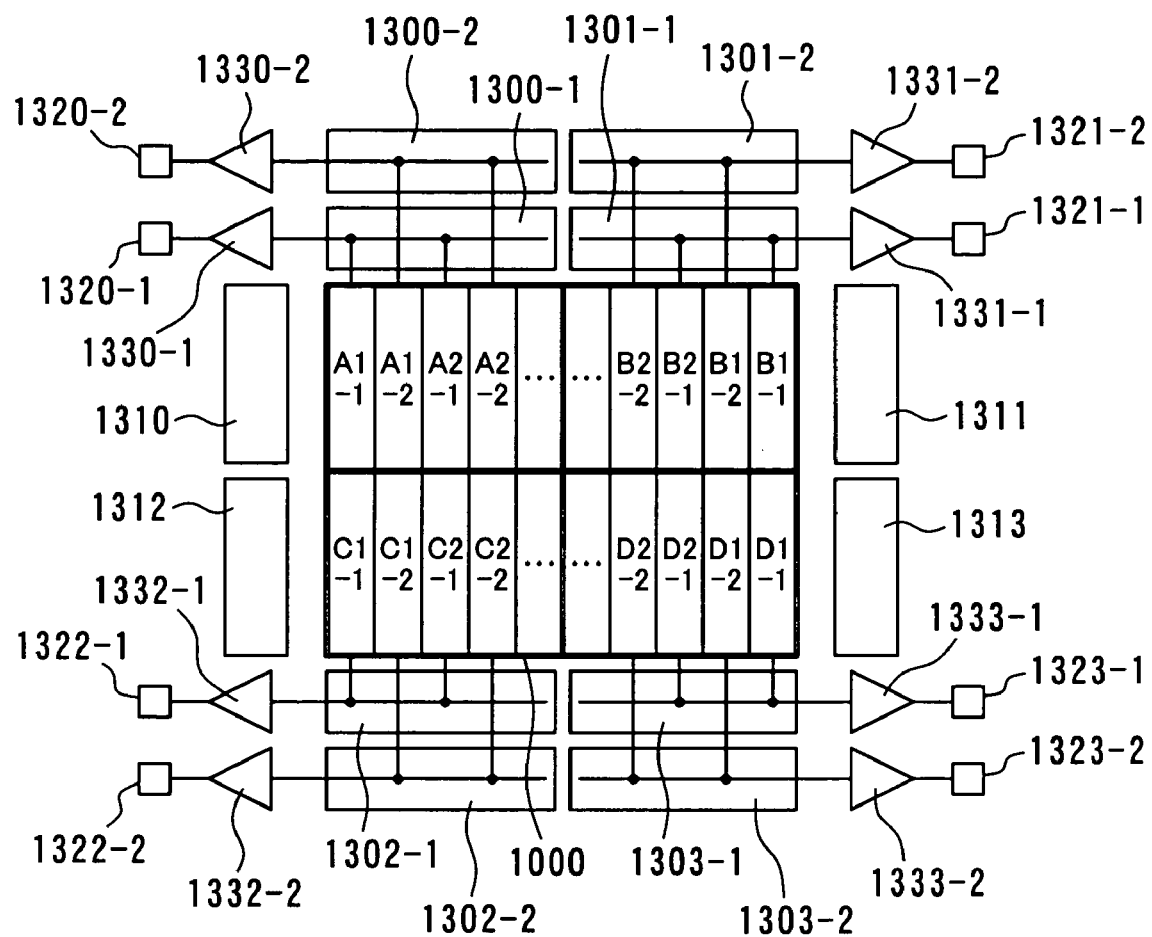
FIG. 4 shows yet another example of solid-state imaging device having a plurality of signal output lines.
Figure 7A:
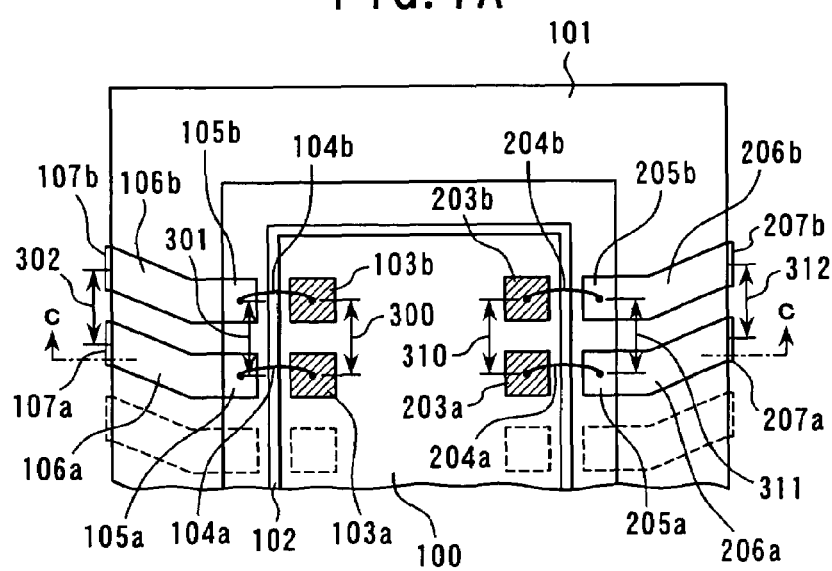
FIGS. 7A to 7C are a top view, side view and sectional view, respectively, showing construction of the package of solid-state imaging device according to a third embodiment of the invention.
Figure 7B:
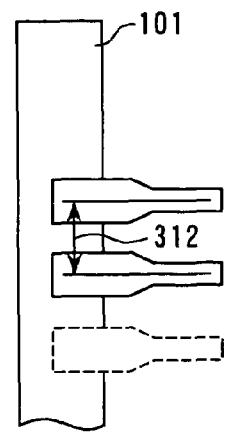
Figure 7C:
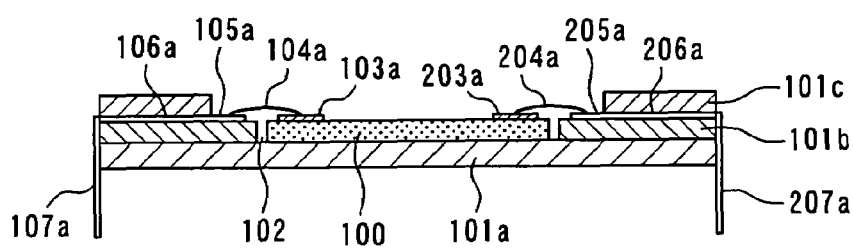

A third embodiment will now be described. Construction of the package of solid-state imaging device according to the third embodiment is shown in FIGS. 7A to 7C. FIG. 7A is a top view; FIG. 7B is a side view; and FIG. 7C is a sectional view along line c-c in FIG. 7A. This embodiment can be applied to a solid-state imaging device having a plurality of signal output lines of the construction shown in FIG. 4.

In this embodiment, signal output pads 103a/103b, 203a/203b indicated by slants and disposed respectively next to each other on the opposite sides of the solid-state imaging device in FIG. 7A each are the pad for outputting image signals. A solid-state imaging device 100 thus having a plurality of pads for outputting image signals is dropped into a concave cavity 102 of a package 101 and is die-bonded thereto. The signal output pad 103a located at one side portion of the solid-state imaging device 100 is connected through a bonding wire 104a to an inner lead portion 105a that is one terminal end portion of a lead frame 106a provided on the package 101. Further, the other end portion of the lead frame 106a is connected to a lead-type electrical external connection means 107a. Similarly, the signal output pad 103b located next to the signal output pad 103a is connected through a bonding wire 104b to an inner lead portion 105b that is one terminal end portion of a lead frame 106b. Further, the other end portion of the lead frame 106b is connected to an electrical external connection means 107b.

Also, the signal output pad 203a located on the other side portion of the solid-state imaging device 100 is connected through a bonding wire 204a to an inner lead portion 205a that is one terminal end portion of a lead frame 206a provided on the same package 101. Further, the other end portion of the lead frame 206a is connected to an electrical external connection means 207a. Similarly, the signal output pad 203b located next to the signal output pad 203a is connected through a bonding wire 204b to an inner lead portion 205b that is one terminal end portion of a lead frame 206b. Further, the other end portion of the lead frame 206b is connected to an electrical external connection means 207b. It should be noted that the solid-state imaging device die-bonded into the interior of the package 101 is to be hermetically sealed with a glass plate (not shown).

The lead frames 106a, 106b, 206a, 206b formed correspondingly to the signal output pads 103a, 103b, 203a, 203b are formed into the same configuration with each other. Further, pitch 301 between the neighboring inner lead portions 105a and 105b, pitch 311 between the neighboring inner lead portions 205a and 205b, pitch 302 between the neighboring electrical external connection means 107a and 107b corresponding respectively to the inner lead portions 105a and 105b, and pitch 312 between the neighboring electrical external connection means 207a, 207b also corresponding respectively to the inner lead portions 205a, 205b are made equal to each other. Here, pitch 300 of the neighboring signal output pads 103a, 103b corresponding to the respective inner lead portions, and pitch 310 of the neighboring signal output pads 203a, 203b can also be made equal to pitches 301, 302, 311, 312 of the inner lead portions and electrical external connection means, and, in this case, the wiring resistance, inductance and stray capacitance of a route of output signals including the bonding wire can be made identical to those of another.

By such construction, the wiring resistance, inter-wire capacitance, inductance, etc., of the wiring routes within the package disposed opposite to each other and next to each other, consisting of the route from the signal output pad to the electrical external connection means through the bonding wire, inner lead portion and lead frame become substantially identical so that difference in signal among a plurality of signals is reduced. As a result, the level discrepancy in the output image signals outputted from the plurality of output signal lines can be suppressed.

Figure 8A:
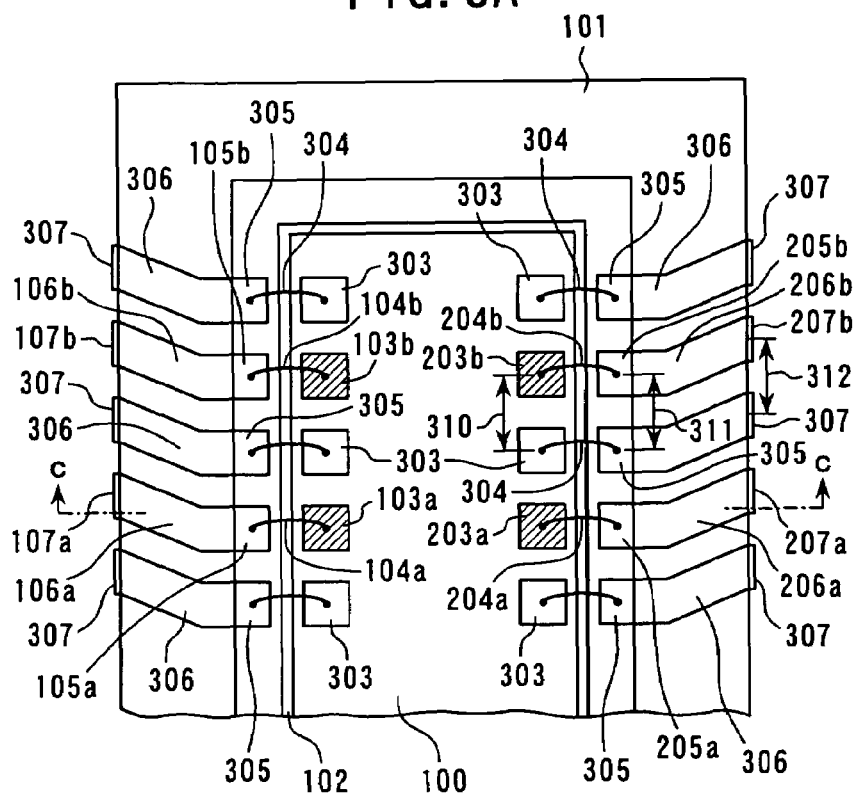
FIGS. 8A to 8C are a top view, side view and sectional view, respectively, showing construction of the package of solid-state imaging device according to a fourth embodiment of the invention.
Figure 8B:
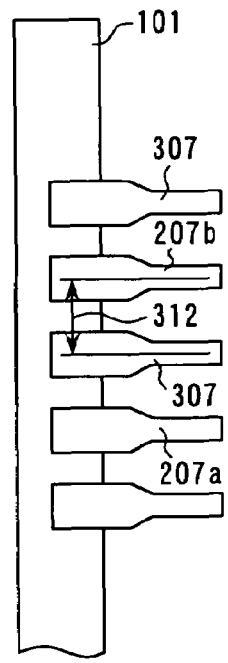
Figure 8C:
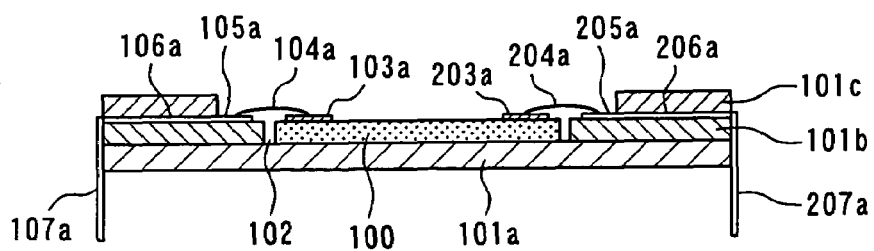

A fourth embodiment will now be described. Construction of the package of solid-state imaging device according to the fourth embodiment is shown in FIGS. 8A to 8C. FIG. 8A is a top view; FIG. 8B is a side view; and FIG. 8C is a sectional view along line c-c in FIG. 8A. In this embodiment, signal output pads 103a/103b, 203a/203b indicated by slants and disposed respectively at a distance from each other on each of the opposite sides of the solid-state imaging device in FIG. 8A each are the pad for outputting image signals. A solid-state imaging device 100 thus having a plurality of pads for outputting image signals is dropped into a concave cavity 102 of a package 101 and is die-bonded thereto. The signal output pad 103a located at one side portion of the solid-state imaging device is connected through a bonding wire 104a to an inner lead portion 105a that is one terminal end portion of a lead frame 106a provided on the package 101. Further, the other end portion of the lead frame 106a is connected to a lead-type electrical external connection means 107a. Similarly, the signal output pad 103b located at a distance from the signal output pad 103a is connected through a bonding wire 104b to an inner lead portion 105b that is one terminal end portion of a lead frame 106b. Further, the other end portion of the lead frame 106b is connected to an electrical external connection means 107b.

Also, the signal output pad 203a located on the other side portion of the solid-state imaging device is connected through a bonding wire 204a to an inner lead portion 205a that is one terminal end portion of a lead frame 206a provided on the same package 101. Further, the other end portion of the lead frame 206a is connected to an electrical external connection means 207a. Similarly, the signal output pad 203b disposed at a distance from the signal output pad 203a is connected through a bonding wire 204b to an inner lead portion 205b that is one terminal end portion of a lead frame 206b. Further, the other end portion of the lead frame 206b is connected to an electrical external connection means 207b.

The lead frames 106a, 106b, 206a, 206b formed correspondingly to the signal output pads 103a, 103b, 203a, 203b are formed into the same configuration with each other. Further, pads 303 located next to the signal output pads 103a, 103b, 203a, 203b are the pads having a function different from the signal output-pads without outputting image signals, and the pad 303 is connected through a bonding wire 304 to an inner lead portion 305 and connected through lead frame 306 formed as a continuation therefrom to an electrical external connection means 307 (hereinafter such construction being referred to simply as "wiring route"). In this embodiment, the configuration of the lead frame 306 within the wiring route without transmitting image signals is formed into the same configuration as the lead frames 106a, 106b, 206a, 206b. Further, the configuration of the inner lead portion 305 within the wiring route is formed into the same configuration as the inner lead portions 105a, 105b, 205a, 205b. Further, the configuration of the electrical external connection means 307 within the wiring route is formed into the same configuration as the electrical external connection means 107a, 107b, 207a, 207b.

The inner lead portion 305 and electrical external connection means 307 within the wiring route are then disposed at equal pitches with respect to the inner lead portion and electrical external connection means corresponding to each signal output pads for outputting image signals. Further, each inner lead portion and each electrical external connection means are disposed so that pitch 311 between the inner lead portion 205b and the inner lead portion 305 within the wiring route becomes equal to pitch 312 between the electrical external connection means 207b and the electrical external connection means 307 within the wiring route.

By such construction, the wiring routes having the same configuration without transmitting image signals are disposed at equal pitches between the plurality of wiring within the package for outputting image signals, for example between the wiring route within the package reaching the electrical external connection means 207b from the signal output pad 203b through the boding wire 204b, inner lead portion 205b and lead frame 206b, and the wiring route within the package reaching the electrical external connection means 207a from the signal output pad 203a through the bonding wire 204a, inner lead portion 205a and lead frame 206a. Such wiring route without transmitting image signals may be formed as a dummy wiring which is not specifically required to transmit an electrical signal.

Using such construction, the wiring resistance, inter-wire capacitance, inductance, etc., of wiring routes within the package formed opposite to each other and at a distance from each other, consisting of the route from the signal output pad to the electrical external connection means through the bonding wire, inner lead portion and lead frame become substantially identical so that difference in signal among a plurality of output signals is reduced. As a result, the level discrepancy in the output image signals outputted from the plurality of output signal lines can be suppressed.

It is also possible that pitch 310 between the image signal output pads 103a, 103b, 203a, 203b, and the pads 303 respectively located next thereto in the wiring route without outputting image signals be made uniform, and, in such case, the wiring resistance, inductance and stray capacitance in the wiring route including the bonding wire can be made identical. As a result, the level discrepancy in the output image signals outputted from the plurality of output signal lines can be further suppressed.

While those of lead-type have shown as the electrical external connection means in the above described embodiments, it is also possible to use means of any other type such as a leadless chip carrier, as far as it is capable of securely providing electrical connection with an external apparatus. Further, while two image signal output pads in the first embodiment, two image signal output pads in the second embodiment, four image signal output pads in the third embodiment, and four image signal output pads in the fourth embodiment have been shown, the number of pads is naturally not limited. Furthermore, while an example of the case of single-layer wiring construction of the lead frame within the package of solid-state imaging device has been shown in describing the above embodiments, the lead frame is not limited to such and may be formed into any number of layers.

With the present invention as has been described by way of the above embodiments, of the package of solid-state imaging device for enclosing the solid-state imaging device for outputting a plurality of image signals, the plurality of signal output pads, inner leads, lead frames and external connection means are disposed with considering their configuration and pitch so that the wiring resistance, inductance and stray capacitance of a plurality of wiring within package are made substantially uniform, making it possible to reduce difference among the plurality of output signals and to suppress the level discrepancy in synthesized image to a lower level.

Some advantages of the package of solid-state imaging device according to each aspect of the invention are as follows. According to the first aspect, since the wiring resistance of a plurality of wiring within package connected to the plurality of signal output pads of the solid-state imaging signals becomes uniform, it is possible to achieve a package of solid-state imaging device where variance in the plurality of signal outputs is reduced.

According to the second aspect, since the wiring resistance, inter-wire capacitance, inductance, etc. of the wiring within package connected to each signal output pad become uniform even in the case where a plurality of signal output pads of the solid-state imaging device are disposed next to each other, it is possible to achieve a package of solid-state imaging device where variance in the plurality of signal outputs is further reduced.

According to the third aspect, since the wiring resistance, inter-wire capacitance, and inductance of the wiring within package connected to each signal output pad become uniform in a wiring route including the wiring connected from the signal output pad to the inner lead even in the case where a plurality of signal output pads of the solid-state imaging device are disposed next to each other, it is possible to achieve a package of solid-state imaging device where variance in the plurality of signal outputs is further reduced.

According to the fourth aspect, since the wiring resistance, inter-wire capacitance, and inductance of the wiring within package connected to each signal output pad become uniform even in the case where a pad having other function is disposed adjacently between a plurality of image signal output pads of the solid-state imaging device, it is possible to achieve a package of solid-state imaging device where variance in the plurality of signal outputs is reduced.

According to the fifth aspect, since the wiring resistance, inter-wire capacitance, and inductance of the wiring within package connected to each signal output pad become respectively uniform in a wiring route including the wiring connected from each signal output pad to the inner lead even in the case where a pad having other function is disposed adjacently between a plurality of image signal output pads of the solid-state imaging device, it is possible to achieve a package of solid-state imaging device where variance in the plurality of signal outputs is further reduced.

What is claimed is:

1. A package of solid-state imaging device for enclosing the solid-state imaging device having a plurality of signal output pads for outputting image signals, provided correspondingly to each of a plurality of image outputs, said package of solid-state imaging device comprising:
    a plurality of inner leads for effecting electrical connection with each of the plurality of signal output pads of said solid-state imaging device;
    a plurality of lead frames each having a same configuration with another, formed correspondingly to each of the plurality of inner leads as continuation therefrom; and
    a plurality of electrical connection means formed as continuously connected to each of the plurality of lead frames,
    wherein said plurality of inner leads, said plurality of lead frames and said plurality of electrical connection means are formed so that a pitch between adjacent inner leads, a pitch between adjacent lead frames and a pitch between adjacent electrical connection means are substantially uniform to each other.

2. The package of solid-state imaging device according to claim 1, wherein said plurality of inner leads and said plurality of electrical connection means are formed so that the pitch between said adjacent inner leads and the pitch between said adjacent electrical connection means are substantially equal to a pitch between adjacent signal output pads of said plurality of signal output pads.

3. The package of solid-state imaging device according to claim 1, wherein said plurality of inner leads, said plurality of lead frames and said plurality of electrical connection means are positioned in at least one side of the solid-state imaging device, and
    wherein a pitch between adjacent inner leads positioned in the one side of the solid-state imaging device, a pitch between adjacent lead frames positioned in the one side of the solid-state imaging device and a pitch between adjacent electrical connection means positioned in the one side of the solid-state imaging device are substantially uniform to each other.

4. The package of solid-state imaging device according to claim 3, wherein said plurality of inner leads, said plurality of lead frames and said plurality of electrical connection means are positioned also in the other side of the solid-state imaging device opposite to the one side of the solid-state imaging device, and
    wherein a pitch between adjacent inner leads positioned in the one side of the solid-state imaging device, a pitch between adjacent inner leads positioned in the other side of the solid-state imaging device, a pitch between adjacent lead frames positioned in the one side of the solid-state imaging device, a pitch between adjacent lead frames positioned in the other side of the solid-state imaging device, a pitch between adjacent electrical connection means positioned in the one side of the solid-state imaging device and a pitch between adjacent electrical connection means positioned in the other side of the solid-state imaging device are substantially uniform to each other.

5. A package of solid-state imaging device for enclosing the solid-state imaging device having a plurality of first signal output pads for outputting image signals, provided correspondingly to each of a plurality of image outputs and a second pad having a function different from said plurality of first signal output pads, said package of solid-state imaging device comprising:
    a plurality of inner leads for effecting electrical connection with each of said plurality of first signal output pads and the second pad;
    a plurality of lead frames each having a same configuration with another, formed correspondingly to each of the plurality of inner leads as continuation therefrom; and
    a plurality of electrical connection means formed as continuously connected to each of the plurality of lead frames;
    wherein a pitch between adjacent inner leads of said plurality of inner leads and a pitch between adjacent electrical connection means of said plurality of electrical connection means are made substantially uniform to each other.

6. The package of solid-state imaging device according to claim 5, wherein said plurality of inner leads and said plurality of electrical connection means are formed so that the pitch between adjacent inner leads and the pitch between adjacent electrical connection means are substantially equal to a pitch between adjacent pads of the plurality of pads including said signal output pads and said second pad.

7. The package of solid-state imaging device according to claim 5, wherein said plurality of inner leads, said plurality of lead frames and said plurality of electrical connection means are positioned in at least one side of the solid-state imaging device, and
    wherein a pitch between adjacent inner leads positioned in the one side of the solid-state imaging device and a pitch between adjacent electrical connection means positioned in the one side of the solid-state imaging device are substantially uniform to each other.

8. The package of solid-state imaging device according to claim 7, wherein said plurality of inner leads, said plurality of lead frames and said plurality of electrical connection means are positioned also in the other side of the solid-state imaging device opposite to the one side of the solid-state imaging device, and wherein a pitch between adjacent inner leads positioned in the one side of the solid-state imaging device, a pitch between adjacent inner leads positioned in the other side of the solid-state imaging device, a pitch between adjacent electrical connection means positioned in the one side of the solid-state imaging device and a pitch between adjacent electrical connection means positioned in the other side of the solid-state imaging device are substantially uniform to each other.

* * * * *